United States Patent [19]

Prideaux et al.

[11] 4,429,178

[45] Jan. 31, 1984

[54] SOLAR TRACKING APPARATUS UTILIZING PHOTOVOLTAIC FLAT PANELS AND METHOD

[75] Inventors: Daniel L. Prideaux, San Jose; Robert M. Spencer, Cupertino, both of Calif.

[73] Assignee: Acurex Solar Corporation, Mountain View, Calif.

[21] Appl. No.: 282,916

[22] Filed: Jul. 13, 1981

[51] Int. Cl.$^3$ ............................................ H01L 31/04
[52] U.S. Cl. .................................... 136/246; 126/424; 126/425; 353/3
[58] Field of Search ........................... 136/246; 353/3; 126/424, 425

[56] References Cited

PUBLICATIONS

S. Pizzini et al, "Development of 1 pkW Photovoltaic Module With Concentration", *Proceedings, 2nd European Community Photovoltaic Solar Energy Conf.* (1979), Reidel Publishing Co. (1979), pp. 532–540.

B. D. Shafer et al, "Low Cost High-Performance, Point-Focus Concentrator Array Design", *Conf. Record,* *14th IEEE Photovoltaic Specialists Conf.* (1980), pp. 754–759.

*Primary Examiner*—Aaron Weisstuch
*Attorney, Agent, or Firm*—Flehr, Hohbach, Test, Albritton & Herbert

[57] ABSTRACT

A technique for converting solar energy directly to electrical energy is disclosed herein and utilizes a plurality of photovoltaic-like flat panels having solar collecting front sides. These panels are supported for simultaneous rotation about a given axis, preferably a horizontal or south sloping axis, while their solar collecting front sides face the same direction. At the same time, these front sides are maintained in end-to-end relationship with one another within a common plane, preferably one which is at all times parallel with the axis of rotation. In actual operation, the photovoltaic-like panels are simultaneously rotated about their given axis in tracking relationship with the sun, preferably so as to maintain the solar collecting front sides of the panels at a fixed acute angle with respect to the sun's rays. Moreover, the panels are preferably supported adjacent to one another in a way which minimizes the distance between endmost panels.

5 Claims, 5 Drawing Figures

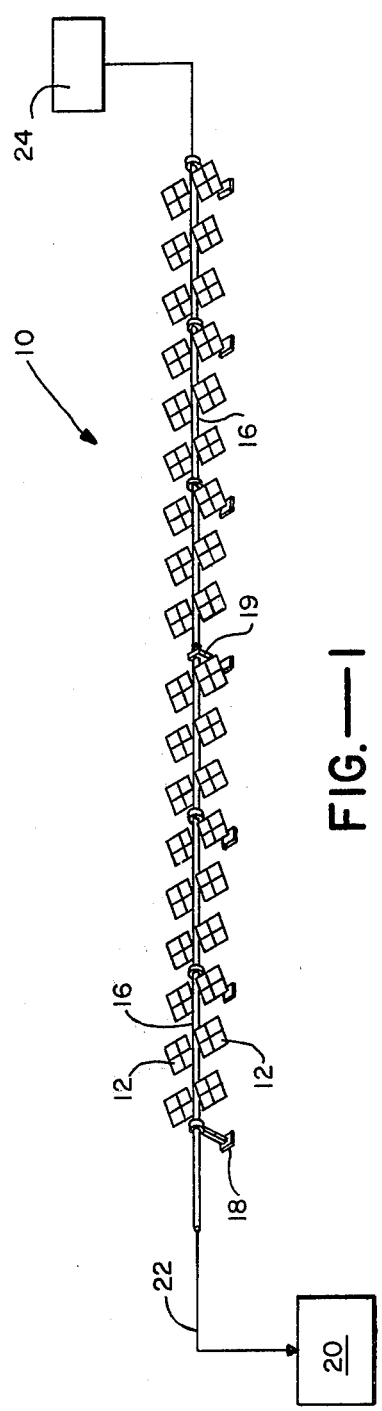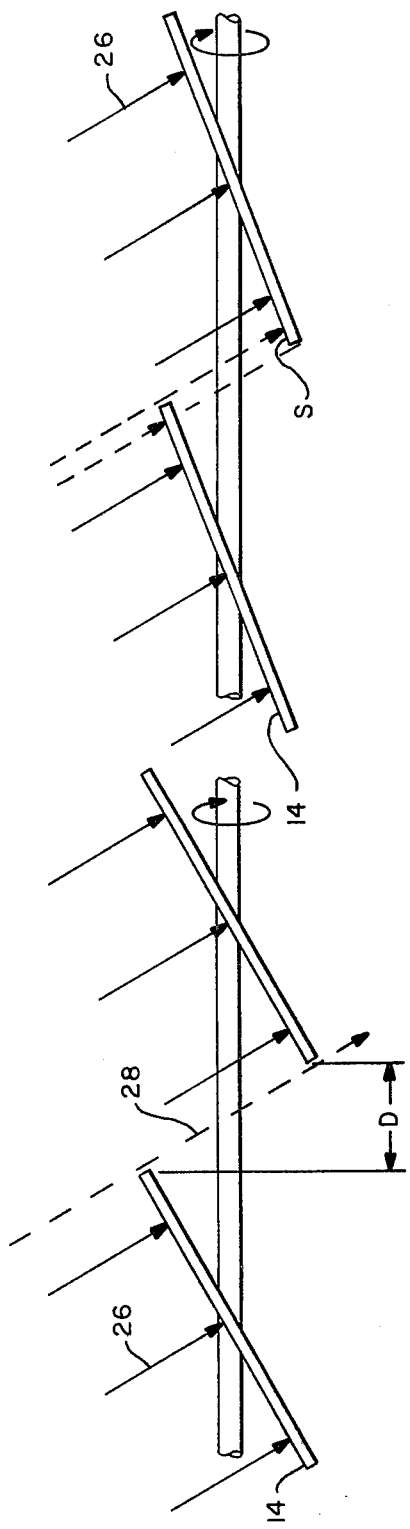

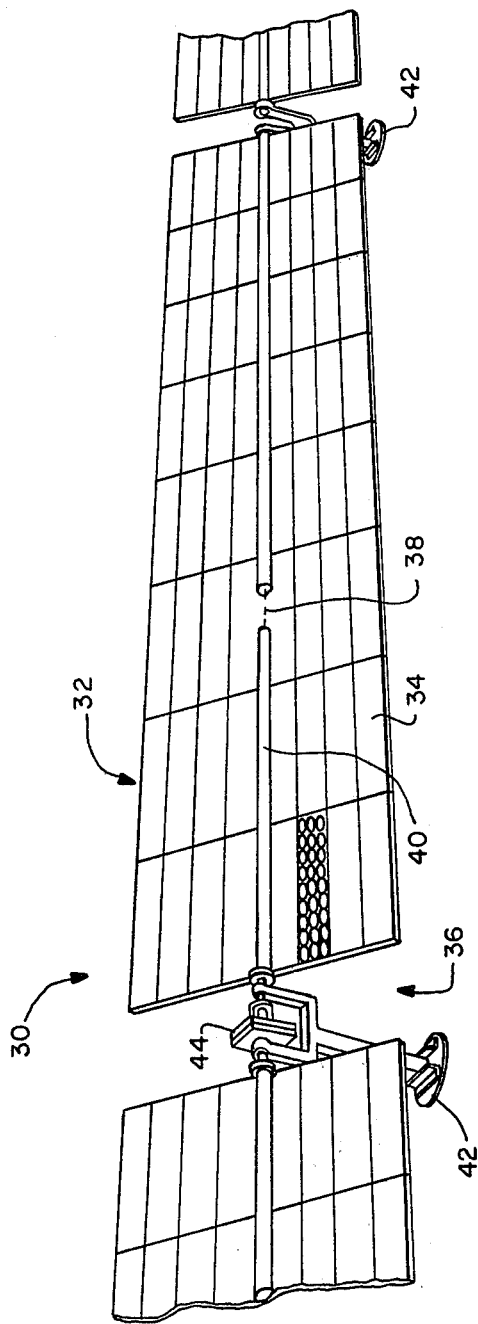
FIG.—3
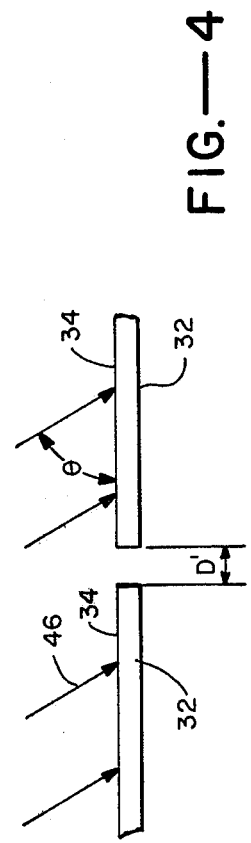
FIG.—4

SOLAR TRACKING APPARATUS UTILIZING PHOTOVOLTAIC FLAT PANELS AND METHOD

The present invention relates generally to techniques for collecting solar energy and more particularly to a specific system for and method of converting solar energy directly to electrical energy utilizing photovoltaic or like flat panels.

As will be seen hereinafter, the present invention is believed to be an improvement to a solar energy conversion technique described in Department of Energy (DOE) publication DOE/ET/23053-1 having a publication date of May 1979 and entitled SOLAR PHOTOVOLTAIC FLAT PANEL APPLICATIONS EXPERIMENT. This particular technique is best described in conjunction with FIGS. 1, 2A and 2B of the drawing. In FIG. 1, a system for carrying out the disclosed technique is illustrated and generally designated by the reference numeral 10. This system includes a plurality of photovoltaic flat panels 12 which may be conventional or otherwise readily providable. Each of the particular panels illustrated is comprised of a number of individual modules which together define a common solar collecting front side 14 best illustrated in FIGS. 2A and 2B. The specific modules disclosed in the DOE publication are manufactured by the Solar Energy Division of Motorola Company under the component designation MSPO1-D30.

As best illustrated in FIG. 1, panels 12 are mounted in pairs on opposite sides of a number of horizontally extending, colinear torque tubes 16 which are supported for rotation about their respective colinear axes by a number of support posts 18. A drive assembly 19 is disposed on one of the support posts between and connected with a given pair of torque tubes for simultaneously rotating these and the other torque tubes in a solar tracking mode to be described below. While not shown in FIG. 1, the various photovoltaic flat panels 12 are interconnected electrically to one another by suitable interconnecting wires so that the electrical power generated by these panels can be combined and carried to a central collecting station 20, as indicated by arrow 22. This arrow could actually be a conduit for some of the wires.

In order to generate the electrical power just recited, all of the panels 12 are simultaneously rotated about torque tubes 16 in tracking relationship with the sun as the latter moves across the sky from sunrise to sunset. To this end, a solar tracking device 24 may be utilized. One such device is manufactured by Acurex Corporation under the component designation Acurex Solar Tracking System. This device and suitable control means (not shown) are interconnected with one another and with drive assembly 19 to simultaneously rotate all of the panels 12 in a way which continuously maintains their respective solar collecting front sides 16 at angles normal to the incoming rays of the sun regardless of the position of the latter in the sky. This is best illustrated in FIG. 2 which shows the positional relationships between two adjacent panels 12 with respect to one another, with respect an associated torque tube 16 and with incoming solar rays generally indicated at 26.

From FIG. 2, it should be apparent that the individual flat panels 12 are disposed in skewed or angled positions relative to torque tubes 16 and that the adjacent ends of adjacent panels sharing a common torque tube are spaced a relatively large horizontal distance D from one another. The purpose for skewing the panels is to insure that the captured solar rays impinge on their solar collecting front sides at normal rather than acute angles thereto. This maximizes the amount of solar energy which can be collected by the active surface areas provided. Stated another way, there is an actual reduction in the amount of solar energy which is collected by a given panel by solar rays impinging on its active surface at angles other than 90°. A discussion of losses in collecting efficiency resulting from acute (nonperpendicular) solar reception can be found in U.S. Pat. No. 4,154,221 which is entitled TRACKING SYSTEM FOR SOLAR ENERGY COLLECTION.

The reason for maintaining the horizontal spacing D between adjacent panels may be best understood with reference to FIG. 2B. There, the two panels 14 illustrated in FIG. 2A are shown in the identical way except that the horizontal spacing D in FIG. 2B has been eliminated. As a result, an upper edge portion of one of the panels (the lefthand panel as viewed in FIG. 2B) shadows a bottom edge portion of the adjacent (righthand) panel. This shaded area S extends between the dotted lines in FIG. 2B and can comprise a relatively large percentage of the otherwise active solar collecting front side of the shadowed panel. For example, in system 10, if panels 12 are 4 feet by 4 feet square and if each is maintained at an acute angle of 20° with its associated torque tube, than the amount of surface area of each panel which is shaded by the next adjacent panel will be approximately 60% of the total area assuming that the horizontal spacing between the two panels is negligible. In order to eliminate this shadow, the adjacent ends of adjacent panels must be spaced from one another such that solar rays just passing over the top edge of the first panel pass under the bottom end of the next adjacent second panel, as indicated by the dotted ray 28 in FIG. 2A. In order to accomplish this with the specific panels just recited, the horizontal spacing D must be approximately 3 feet.

It should be apparent from the foregoing, that system 10 provides a technique for optimizing the collection of solar energy when using photovoltaic flat panels which are limited in size because of physical constraints. However, a major disadvantage with this technique is that it requires an unduly large amount of space for any given number of longitudinally spaced panels. For example, when 16 pairs of panels of the size recited above are mounted longitudinally along torque tubes 16 at the acute angle recited above, the total amount of space required between the furthest edges of the endmost panels is 55 feet. While a small amount of this space is required by support posts 18 and drive assembly 19, much of the space is attributed to the accumulated horizontal spacing required to prevent the shadowing effect described above. Approximately 26 feet of the total is required for this purpose.

Another disadvantage of system 10 indirectly results from the large spacing requirement between adjacent panels. More specifically, the length of electrical wiring needed to carry the electrical power generated at the individual panels to a common collecting station, for example, station 20, is directly dependent upon the spacing between these panels. Increases in the amount (length) of wiring or bus work required to accomplish this increases actual losses in electrical power collected at the collecting station as a result of resistance losses through transmission. It has been found that eliminating this spacing and the necessary wiring resulting from this spacing would increase the actual collected power by as much as 2%.

In view of the foregoing, it is a primary object of the present invention to provide a solar energy conversion system of the type generally described above, that is, one which converts solar energy directly to electrical energy utilizing photovoltaic flat panels or the like, but one which does not have the disadvantages recited above.

A more particular object of the present invention is to provide a technique for converting solar energy directly to electrical energy utilizing photovoltaic flat panels or the like without the necessity to space adjacent panels from one another for purposes of preventing one panel from shading another.

Another particular object of the present invention is to achieve the last-mentioned object in part by placing the active solar collecting area of each panel at an acute angle with the incoming solar rays rather than at 90° but without decreasing the actual electrical power collected.

As will be seen hereinafter, the technique disclosed herein utilizes a specific arrangement for supporting its photovoltaic flat panels or the like for movement with the sum from sunrise to sunset. This arrangement includes first means supporting all of the panels for simultaneous rotation about a given axis such that the solar collecting front sides of the panels are maintained in end-to-end relationship with one another within a common plane and face in the same direction. The arrangement includes second means cooperating with the first means for simultaneously rotating the panels about their given axis in tracking relationship with the sun.

By maintaining the solar collecting front sides of the panels in end-to-end relationship with one another within a common plane, there is no possibility that any one panel will shadow another. In a preferred embodiment, the panels are mounted such that their solar collecting front sides are at all times parallel with the axis of rotation and the latter preferably extends horizontally. This positional configuration provides for a relatively uncomplicated support arrangement for the panels but, at the same time, requires that the solar collecting front sides of these panels be maintained at an acute angle with the incoming solar rays. As will be discussed in more detail hereinafter, the amount of energy lost as a result of this angular relationship between the solar collecting surfaces of the panels and the incoming solar rays (as compared to an angular relationship of 90°) is at least offset by the decrease in transmission losses resulting from the decrease in spacing between adjacent panels.

The present technique will be described in more detail below in conjunction with the drawings wherein:

FIG. 1 is a diagrammatic illustration, partially in perspective view, of a solar energy conversion system of the type disclosed in the previously recited Department of Energy publication;

FIG. 2A diagrammatically illustrates the positional relationship between incoming solar rays and two adjacent solar collecting panels forming part of the system of FIG. 1;

FIG. 2B diagrammatically illustrates a modified positional relationship of incoming solar rays and the two panels illustrated in FIG. 2A when the panels are positioned sufficiently close to one another to eliminate horizontal spacing therebetween;

FIG. 3 is a perspective view of part of an overall solar energy conversion system designed in accordance with the present invention; and FIG. 4 diagrammatically illustrates a positional configuration of incoming solar rays and two adjacent panels forming part of the overall system of FIG. 3.

Turning now to the drawings, attention is immediately directed to FIG. 3 since FIG. 1 and FIGS. 2A and 2B have been discussed previously. In FIG. 3, part of a solar energy conversion system designed in accordance with the present invention is illustrated, as stated above. This system is generally indicated at 30 and includes a plurality of solar photovoltaic flat panels 32. While these panels may be identical to previously described panels 12, they are preferably much larger than the panels 12 and, as seen in FIG. 3, they are rectangular in configuration rather than square. In an actual working embodiment, each panel is approximately 32' long by approximately 8' wide and is made up of sixteen 4' by 4' photovoltaic (pv) module panels which are interconnected together as a single unit to define a continuous, flat solar collecting front side 34. In this actual working embodiment, the individual 4' by 4' pv module panels are made up of four 1' by 4' modules which are manufactured by ARCO Solar Corporation.

As stated above, overall system 30 includes a plurality of the panels 32, only three of which are illustrated in FIG. 3. However, in an actual working embodiment, the entire system is comprised of eight panels. An arrangement generally indicated at 36 is provided for supporting all of these panels for simultaneous rotation about a given axis 38 indicated by dotted lines in FIG. 3 such that the solar collecting front sides 34 of all of the panels are maintained in end-to-end relationship with one another within a common plane and face in the same direction during rotation of the panels. By maintaining a coplanar positional relationship between the various solar collecting front sides 34, the shadowing problem described above is eliminated, as best illustrated in FIG. 4. As seen there, no matter how close the adjacent ends of adjacent panels are placed, any one panel cannot shade another panel. In fact, the adjacent ends of adjacent panels could be placed right next to one another. However, as will be discussed below, a minimal amount of room is required for support posts similar to previously described posts 18 and at least one drive assembly, for example one similar to drive assembly 19. The spacing D' illustrated in FIG. 4 is provided for that purpose.

Overall support arrangement 36 is shown in FIG. 3 including a plurality of colinear torque tubes 40 which may be similar to torque tubes 16, a plurality of support posts 42 which may be indentical to support posts 18 and at least one drive assembly 44 which may be identical to assembly 19 and which is supported by one of the posts 42. In a preferred embodiment, all of the torque tubes are supported in a horizontally extending direction for simultaneous rotation about previously mentioned axis 38 by posts 42. Each individual torque tube, which is preferably hollow for reasons to be discussed below, is responsible for supporting an associated panel 34 for rotation about axis 38. In the system illustrated and in a preferred embodiment, each torque tube 40 is fixedly connected by suitable means to and across the length of front side 34 of its associated panel. In this way, axis 38 and the common plane through all of the panel front sides remain parallel as the panels are rotated about the axis. By providing this positional relationship between the panels and axis 38, support arrangement 36 is made relatively uncomplicated and economical to provide. However, as stated previously, because of this positional relationship, the sun's rays will not impinge on the solar collecting front sides 34 of the panels at angles normal thereto (in most geographic locations). This is best illustrated in FIG. 4 which shows incoming rays 46 at an acute angle $\theta$ with front sides 34.

In an actual working embodiment of system 30 at a location in Mountain View, Calif. (35-38 North latitude), based on a system having the particular configuration illustrated in FIG. 3 utilizing the specific panels recited above, it has been determined that providing this angled relationship between the solar collecting front sides 34 of the panels and the incoming solar rays results in an actual loss in collected solar energy of approximately 1.5% over what could be collected by the panels positioned to collect solar rays at angles of 90°. Nevertheless, this loss in collection efficiency is offset by an increase in actual power collected resulting from reduced power transmission losses, as will be discussed in more detail below.

In addition to panels 32 and support arrangement 36, overall system 30 includes a solar tracking device 24 (shown only in FIG. 1) and electrical wiring interconnecting together the various panels for carrying the electrical power generated thereby to a central collection station 20 (illustrated only in FIG. 1). In actual practice, the wiring could be carried through the various torque tubes or a common bus (not shown) could be provided between the panels and the central collecting station. Wiring is also provided between device 24 and drive assembly 44 which includes a suitable drive motor, suitable means coupling the drive motor to the adjacent torque tubes and means responsive to signals from device 24 for operating the motor such that the latter rotates the panels in tracking relationship with the sun. More specifically, as the sun moves across the sky from sunrise to sunset, device 24 causes the drive assembly 44 to maintain the positional relationship illustrated in FIG. 4 between the solar collecting front sides 34 of the panels and incoming solar rays 46.

Because of the coplanar configuration of the various panels 32, the spacing between adjacent ends of the panels can be minimized. In fact, the only necessary spacing between adjacent ends of adjacent panels is that which will accommodate the support post 42 or a combination support post and drive assembly 44. In the actual working embodiment recited above, that is, one utilizing eight of the specifically described panels 32, the spacing between the adjacent ends of adjacent panels including only a support post is approximately 8 inches and the spacing between the support post including a drive assembly is 2 feet, 2 inches. Moreover, the total length between the extreme ends of endmost panels in this asssembly is approximately 263 feet. In order to provide the same amount of solar collecting surface area in system 10, at the same geographic location, the distance between the extreme ends of endmost panels would be approximately 448 feet, which is a substantially greater distance. In fact, based on the particular mode of carrying the electrical power generated in system 30, this added distance would result in a power transmission loss of at least approximately 1.5%. Therefore, the reduction in transmission losses using system 30 offsets the gain in solar collection which would be achieved by system 10. Furthermore, system 30 takes up substantially less space which may be critical or at least it will result in a substantial cost savings. In addition, there is a substantial savings in wiring using system 30 and support arrangement 36 has been found to be substantially less complicated than the corresponding arrangement used in system 10.

System 10 has been described in connection with solar photovoltaic flat panels of the specific type manufactured by the Solar Energy Division of the Motorola Company. It is to be understood that the present invention is not limited to the use of these particular panels but may include any suitable solar collecting plates which convert solar energy directly to electrical power or otherwise require electrical wiring between the individual panels and a common collecting station. For purposes of clarity herein, all of these panels, whether they are actual photovoltaic flat panels or not, may be generically referred to as photovoltaic-like panels. It is also to be understood that the present invention is not limited to the illustrated positional relationship between the various panels 32 and their associated torque tubes 40, although this positional relationship is preferred. Certainly, the torque tubes could be located on the back sides of the panels and, in fact, it is possible to eliminate the torque tubes by providing suitable structural means interconnecting the panels themselves directly to a means of rotation. Moreover, while the common plane including the solar collecting front sides of the panels and axis 38 are preferably parallel to one another throughout rotation of the panels, system 30 could be provided such that this is not the case. However, a nonparallel relationship of this type between the common plane and the torque tube would result in a more complicated support arrangement for the panels.

What is claimed is:

1. A system for converting solar energy directly to electrical energy, said system comprising: a plurality of photovoltaic or like type flat panels, each of which includes a solar collecting front side and means for generating electricity directly from the sun's rays as the latter impinges on said front side; an arrangement supporting said panels for movement about a single axis only with the sun between sunrise and sunset, said supporting arrangement including first means supporting all of said panels for simultaneous rotation about said single axis such that the solar collecting front sides of said panels are maintained in end-to-end relationship with one another in direct contact with the sun's rays and within a common plane parallel to said axis of rotation and face in the same direction during rotation of the panels and second means cooperating with said first means for simultaneously rotating said panels about said axis in tracking relationship with the sun, said second means including means responsive to the position of the sun between sunrise and sunset for continuously maintaining said panel front sides at an acute angle with respect to the sun's rays and said first means including supporting mechanisms disposed between adjacent ends of at least some of said panels for supporting said panels for said rotation about said axis, the adjacent ends of said panels being spaced from one another only an amount sufficient to accommodate an associated one of said supporting mechanisms whereby to minimize the linear distance between panels; and electrical wire means connected with said panels for carrying the electrical energy generated thereby to a central collecting station.

2. A system according to claim 1 wherein said acute angle is of a value which causes each of said panels to generate a predetermined lesser amount of electricity during a given period than it would generate if said angle were 90°, wherein the overall distance between the endmost ones of said plurality of panels is at least a predetermined amount less than this distance would have to be to prevent shadows from being cast onto ones of said panels from adjacent panels if the panel front sides were maintained at a 90° angle with the sun's rays, and wherein as a result of said lasser distance the length of said wire means can be reduced by a predetermined amount which will reduce electrical transmission losses along said wire means an amount sufficient to offset said lesser amount of generated electricity.

3. In a system for converting solar energy directly to electrical energy by means of a plurality of photovoltaic or like type flat panels, an arrangement adapted to support said panels for movement with and at a fixed orientation to the sun as the latter moves across the sky from sunrise to sunset, said support arrangement comprising: an assembly of components supporting all of said panels for simultaneous rotation about a single horizontal axis and only said axis such that the solar collecting front sides of said panels face in the same direction in direct contact with the sun's rays and are maintained in end-to-end relationship with one another within a common plane which is at all times parallel with said axis during rotation of said panels, said assembly of components including a plurality of rods repectively connected with and extending the length of said flat panels along said axis and a number of support mechanisms disposed between adjacent ends of at least some of the panels for supporting said rods and therefore said panels for rotation about said axis, said adjacent panel ends being spaced from one another only amounts sufficient to accommodate associated ones of said supporting mechanisms whereby to minimize the linear distance between said panels; and drive means cooperating with said assembly of components for simultaneously rotating the panels about said axis in tracking relationship with the sun, said drive means including tracking means responsive to the position of the sun as the latter moves across the sky for continuously maintaining said panel front sides at an acute angle with respect to the sun's rays.

4. A method for converting solar energy directly to electrical energy, said method comprising the steps of: providing a plurality of photovoltaic or like type flat panels each of which includes a solar collecting front side and means for generating electricity directly from the sun's rays as the latter impinge directly on said front side; supporting all of said panels for simultaneous rotation about a single axis only such that the solar collecting front sides of said panels are maintained in end-to-end relationship with one another within a common plane and face in the same direction during rotation, said panels being supported by mechanisms which are disposed between adjacent ends of at least some of said panels for supporting the latter for said rotation, said adjacent panels having their adjacent ends spaced from one another only an amount sufficient to accommodate an associated one of said supporting mechanisms whereby to minimize the linear distance between panels; simultaneously rotating said panels about said axis in a way which continuously maintains said panel front sides at an acute angle with respect to the sun's rays during movement of the latter across the sky from sunrise to sunset; and carrying the electrical energy generated by said panels to a central collecting station.

5. A method according to claim 4 wherein said acute angle is of a value which causes each of said panels to generate a predetermined lesser amount of electricity during a given period than would be generated if said angle were 90°, wherein the overall distance between the endmost ones of said plurality of panels is at least a predetermined amount less than this distance would have to be to prevent shadows from being cast onto ones of said panels from adjacent panels if the panel front sides were maintained at a 90° angle with the sun's rays, and wherein as a result of said lesser distance the length along which said generated electricity must be carried to reach said central collecting station is reduced an amount sufficient to reduce electrical transmission losses by a predetermined amount, said reduction in transmission losses being sufficient to offset said lesser amount of generated electricity.

* * * * *